United States Patent
Lin

(10) Patent No.: US 7,292,489 B2
(45) Date of Patent: Nov. 6, 2007

(54) CIRCUITS AND METHODS OF TEMPERATURE COMPENSATION FOR REFRESH OSCILLATOR

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 134 days.

(21) Appl. No.: 11/215,495

(22) Filed: Aug. 30, 2005

(65) Prior Publication Data

US 2005/0285626 A1 Dec. 29, 2005

Related U.S. Application Data

(62) Division of application No. 10/685,732, filed on Oct. 14, 2003, now Pat. No. 6,992,534.

(51) Int. Cl.
*G11C 7/00* (2006.01)

(52) U.S. Cl. .................................... 365/222

(58) Field of Classification Search ........... 365/189.01, 365/222; 331/65–66
See application file for complete search history.

(56) References Cited

U.S. PATENT DOCUMENTS

| | | | |
|---|---|---|---|
| 4,748,350 A | 5/1988 | Emori | |
| 4,751,463 A | 6/1988 | Higgs et al. | |
| 4,823,070 A | 4/1989 | Nelson | |
| 4,906,913 A | 3/1990 | Stanojevic | |
| 5,159,206 A | 10/1992 | Tsay et al. | |
| 5,260,646 A | 11/1993 | Ong | |
| 5,384,498 A | 1/1995 | Wong | |
| 5,499,213 A * | 3/1996 | Niimi et al. | ................. 365/222 |
| 5,552,739 A | 9/1996 | Keeth et al. | |
| 5,552,740 A | 9/1996 | Casper | |
| 5,557,579 A | 9/1996 | Raad et al. | |
| 5,563,499 A | 10/1996 | Pinney | |
| 5,631,547 A | 5/1997 | Fujioka et al. | |
| 5,642,073 A | 6/1997 | Manning | |
| 5,644,215 A | 7/1997 | Casper | |
| 5,686,820 A | 11/1997 | Riggio, Jr. | |
| 5,699,024 A | 12/1997 | Manlove et al. | |
| 5,945,818 A | 8/1999 | Edwards | |
| 6,111,394 A | 8/2000 | Casper | |
| 6,271,710 B1 | 8/2001 | Ooishi | |
| 6,369,712 B2 | 4/2002 | Letkomiller et al. | |
| 6,377,499 B1 | 4/2002 | Tobita | |
| 6,731,558 B2 | 5/2004 | Yamauchi et al. | |
| 6,992,534 B2 | 1/2006 | Lin | |
| 2005/0280479 A1 | 12/2005 | Lin | |

* cited by examiner

*Primary Examiner*—David Mis
(74) *Attorney, Agent, or Firm*—Schwegman, Lundberg & Woessner, P.A.

(57) ABSTRACT

A memory device has refresh cycles to refresh memory cells of the memory device. The time interval between one refresh cycle to the next refresh cycle is a refresh interval. The refresh interval depends on a frequency of an oscillating signal. A refresh timer adjusts the frequency of the oscillating signal based on changes in the temperature to adjust the refresh interval.

56 Claims, 6 Drawing Sheets

CIRCUITS AND METHODS OF TEMPERATURE COMPENSATION FOR REFRESH OSCILLATOR

This application is a Divisional of U.S. application Ser. No. 10/685,732, filed Oct. 14, 2003, now U.S. Pat. No. 6,992,534, which is incorporated herein by reference.

FIELD OF INVENTION

The present invention relates generally to semiconductor devices, more particularly to refresh operation in memory devices.

BACKGROUND

Semiconductors devices such as memory devices reside in many computers and electronic products. A typical memory device has many memory cells to store data.

The data in a memory cell is represented by a charge. The charge loses its value over time due to leakage and other factors, causing the data to become invalid. To retain the validity of the data, a typical memory device frequently performs a refresh operation at a specific refresh interval to restore (or refresh) the charges to their original values.

In some cases, a change in the temperature causes a conventional memory device to perform the refresh operation more frequently than necessary. For example, when the temperature deceases, a conventional memory device may perform more refresh operation than that at a higher temperature. Thus, power is wasted.

SUMMARY OF THE INVENTION

The present invention provides circuits and methods for controlling the refresh intervals of a memory device based on changes in the temperature to save power.

One aspect includes a memory device having an oscillator for generating an oscillating signal with an oscillating frequency. A timing generator generates a refresh signal based on the oscillating frequency. A variable bias generator generates a current dependent on temperature to influence the oscillating frequency to adjust the cycle of the refresh signal when the temperature changes. When the cycle of the refresh signal is adjusted, the refresh interval of the memory device is adjusted.

Another aspect includes a method of refreshing a memory device. The method generates an oscillating signal having a cycle inversely proportional to the temperature. Based on the cycle of the oscillating signal, the method generates a refresh signal. The method refreshes memory cells of the memory device at a refresh interval based on the cycle of the refresh signal.

DETAILED DESCRIPTION OF THE EMBODIMENTS

Figure 1:
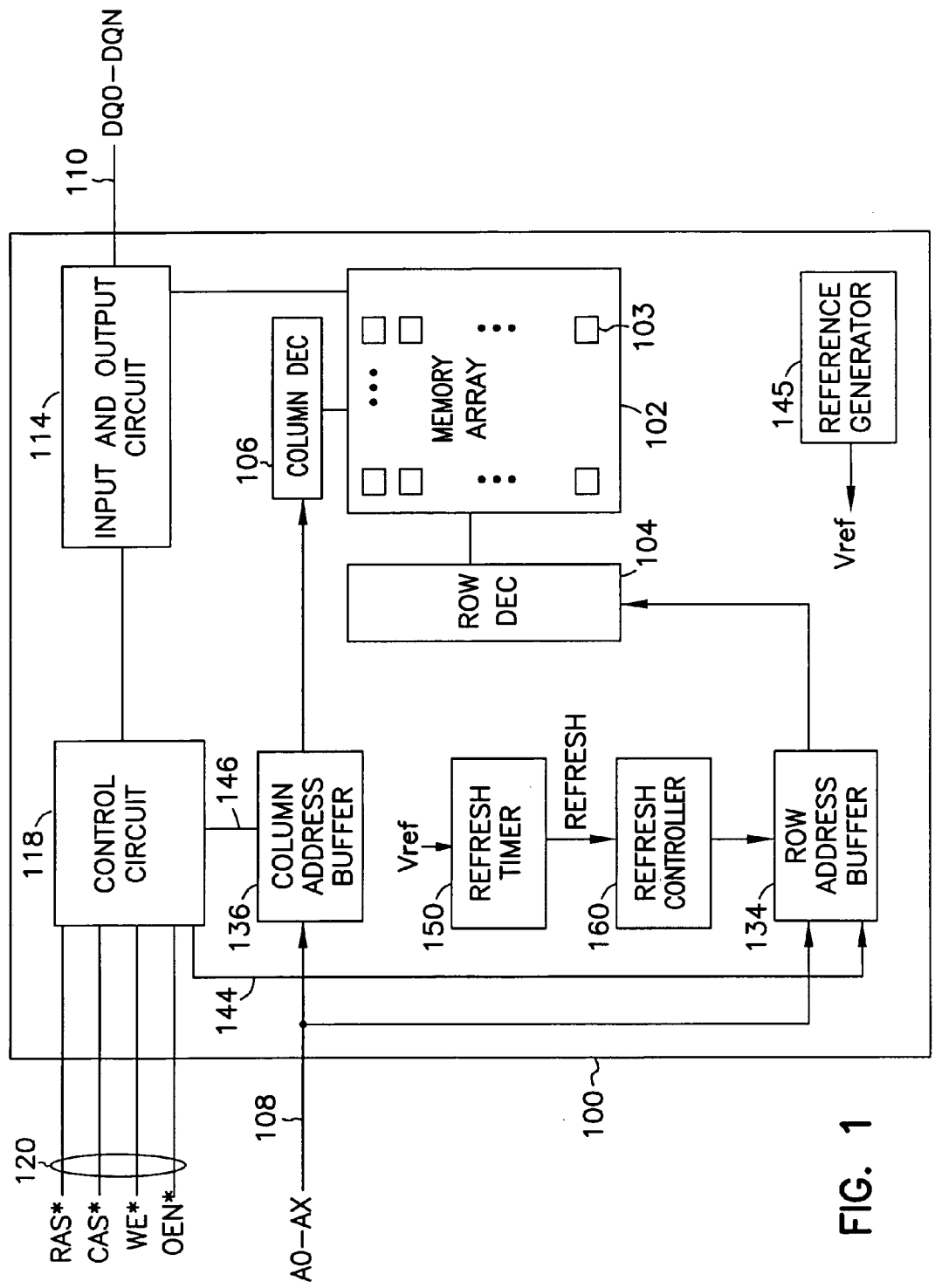
FIG. 1 shows a memory device according to an embodiment of the invention.

The following description and the drawings illustrate specific embodiments of the invention sufficiently to enable those skilled in the art to practice the invention. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

FIG. 1 shows a memory device according to an embodiment of the invention. Memory device 100 includes a memory array 102 having a plurality of memory cells 103 arranged in rows and columns.

Row decoder 104 and column decoder 106 access memory cells 103 in response to address signals A0 through AX (A0-AX), provided on address lines (or address bus) 108.

A row address buffer 134 transfers row addresses on lines 108 to row decoder 104 based on signal on line 144. A column address buffer 136 transfers column addresses on lines 108 to column decoder 106 based on signal on line 146.

An input and output circuit 114 transfers data between memory array 102 and data lines (or data bus) 110. Data signals DQ0 through DQN (DQ0-DQN) represent data transferred to and from memory array 102.

A reference generator 145 generates a reference voltage Vref. In some embodiments, Vref is temperature independent. In some embodiments, reference generator 145 includes a bandgap-based circuit to generate the temperature independent Vref.

A refresh timer 150 generates a refresh signal REFRESH during a refresh operation of memory device 100. Refresh controller 160 receives the REFRESH signal to perform the refresh operation.

A control circuit 118 controls the modes of operations of memory device 100 based on control signals on control input lines 120. Examples of the modes of operation of memory device 100 include a read mode, a write mode, and a refresh mode. Examples of the control signals on lines 120 include a Row Access Strobe signal RAS*, a Column Access Strobe CAS* signal, a Write Enable signal WE*, and an Output Enable signal OEN*.

A write mode writes data from data lines 110 to memory cells 103. A read mode reads data from memory cells 103 to data lines 110. The address of a row or a column of memory cells 103 being read or written is provided by a combination of the address signals A0-AX.

A refresh mode refreshes data in memory cells 103. Refresh timer 150 controls the refresh intervals using the REFRESH signal. Refresh controller 160 controls other tasks during the refresh operation such as selecting the rows of memory cells 103 for refreshing. In some embodiments, refresh controller 160 include a row counter to sequentially select the rows of memory array 102 for refreshing during the refresh operation.

Memory device 100 may be a dynamic random access memory (DRAM) device. Examples of DRAM devices include synchronous DRAM commonly referred to as SDRAM, SDRAM II, SGRAM (Synchronous Graphics Random Access Memory), DDR SDRAM (Double Data Rate SDRAM), DDR II SDRAM, DDR III SDRAM, GDDR III SDRAM (Graphic Double Data Rate), and Rambus DRAM devices. Memory device 100 includes other elements, which are not shown for clarity.

In this specification, a refresh operation is also referred to as a refresh cycle. A refresh interval is also referred to as a refresh cycle time. A refresh interval (refresh cycle time) is the time lapsed between two consecutive refresh operations (refresh cycles). For example, if the time lapsed between one refresh cycle and the next consecutive refresh cycle is N miliseconds, then the refresh interval is N milliseconds. N is a positive number. When a refresh interval is expanded, the time lapsed between two consecutive refresh operations becomes greater (longer). For example, if an N millisecond refresh interval is expanded, the expanded refresh interval would be M milliseconds where M is greater than N.

An increase in refresh cycle time means the time (lapsed time) between two consecutive refresh operations becomes greater (longer). Memory device 100 performs fewer refresh operations when the refresh cycle time increases.

A decrease in refresh cycle time means the time between two consecutive refresh operations becomes smaller (shorter). The memory device 100 performs more refresh operations when the refresh cycle time decreases.

Figure 2:
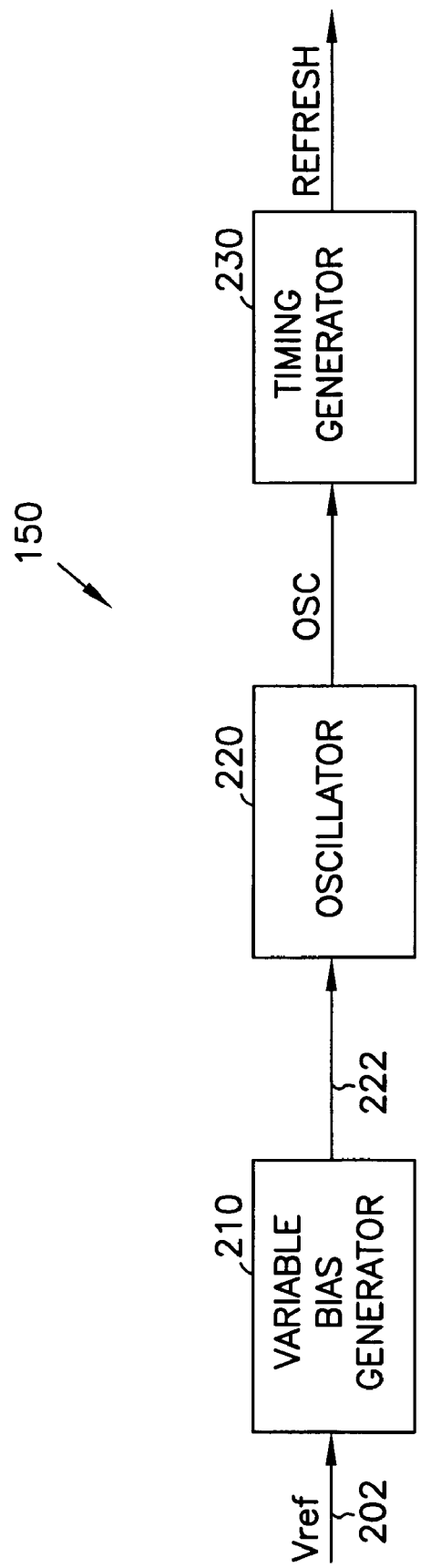
FIG. 2 shows a refresh timer according to an embodiment of the invention.

FIG. 2 shows a refresh timer according to an embodiment of the invention. Refresh timer 150 includes a variable bias generator 210, an oscillator 220, and a timing generator 230. Oscillator 220 generates an oscillating signal OSC. The OSC signal is used to measure time. Timing generator 230 generates the REFRESH signal based on the OSC signal. Thus, the frequency of the REFRESH signal depends on the frequency of the OSC signal. The REFRESH signal is used to control the refresh cycle time (the refresh interval between two consecutive refresh cycles).

Variable bias generator 210 automatically adjusts the frequency of the OSC signal based on changes in the temperature. When the OSC signal is adjusted, the REFRESH signal is also adjusted. For example, when the temperature decreases, memory device 100 (FIG. 1) may need fewer refresh operations. In the example where the temperature decreases, variable bias generator 210 automatically decreases the frequency of the OSC signal. Because the frequency of the REFRESH signal depends on the frequency of the OSC signal, the frequency of the REFRESH signal also automatically decreases, leading to fewer refresh operations. Fewer refresh operations result in less power consumption.

The OSC signal is temperature dependent. The frequency of the OSC signal is proportional to the temperature. When the temperature increases, the frequency of the OSC signal increases. When the temperature decreases, the frequency of the OSC signal decreases. Since the frequency of a signal is an inverse of the cycle (period or cycle time) of the signal, the cycle increases when the frequency decreases; the cycle decreases when frequency increases. Thus, in terms of cycle, the cycle of the OSC signal is inversely proportional to the temperature. When the temperature increases, the cycle of the OSC signal decreases. When the temperature decreases, the cycle of the OSC signal increases.

The REFRESH signal is generated from the OSC signal. Thus, the REFRESH signal is also temperature dependent because the OSC is temperature dependent. The relationship between the REFRESH signal and the temperature is similar to the relationship between the OSC signal and the temperature. The frequency of the REFRESH signal is proportional to the temperature. When the temperature increases, the frequency of the REFRESH signal increases. When the temperature decreases, the frequency of the REFRESH signal decreases. In terms of cycle, the cycle of the REFRESH signal is inversely proportional to the temperature. When the temperature increases, the cycle of the REFRESH signal decreases; when the temperature decreases, the cycle of the REFRESH signal increases.

In some embodiments, the frequency of the REFRESH is lower than the frequency of the OSC signal. Thus, the cycle (period) of the REFRESH signal is greater than the cycle of the OSC signal.

In some embodiments, timing generator 230 includes a counter to count the cycles of the OSC signal and generates a refresh pulse after a fixed number of counts. Thus, many refresh pulses are generated after many different series of fixed number of counts. For example, a first refresh pulse is generated after a first series of fixed number of counts and a second refresh pulse is generated after a second series of fixed number of counts. In some embodiments, many refresh pulses generated by timing generator 230 constitute the REFRESH signal. In these embodiments, the cycle of the REFRESH signal is the interval between two consecutive refresh pulses. In some embodiments, the refresh cycle time or refresh interval is based on the cycle of the REFRESH signal. For example, the refresh cycle time may be equal to one cycle of the REFRESH signal.

When the refresh cycle time is based on the cycle of the REFRESH signal, the refresh cycle time is proportional to the cycle of the REFRESH signal. For example, when the cycle (interval between two consecutive refresh pulses) of the REFRESH signal increases, the refresh cycle time increases; when the cycle of the REFRESH signal decreases, the refresh cycle time decreases. As discuss above, the cycle of the REFRESH signal is inversely proportional to the temperature. Thus, the refresh cycle time increases when the temperature decreases; the refresh cycle time decreases when the temperature increases.

Variable bias generator 210 connects to a reference node 202 to receive reference voltage Vref. In some embodiments, node 202 is an output of a reference generator such as reference generator 145 (FIG. 1). In some embodiments, Vref is temperature independent. Variable bias generator 210 connects to oscillator 220 via line 222 to influence the relationship between the OSC signal and temperature. In some embodiments, variable bias generator 210 influences the relationship between the OSC signal and temperature by adjusting the frequency or the cycle of the OSC signal when the temperature changes. Variable bias generator 210 decreases the frequency (increases the cycle) of the OSC signal when the temperature decreases. Variable bias generator 210 increases the frequency (decreases the cycle) of the OSC signal when the temperature increases. Thus, variable bias generator 210 influences the relationship between the OSC signal and the temperature by causing the frequency of the OSC signal to be proportional to the temperature or by causing the cycle of the OSC signal to be inversely proportional to the temperature.

Since variable bias generator 210 adjusts the frequency or cycle of the OSC signal in response to changes in the temperature, variable bias generator 210 also indirectly adjusts the frequency or cycle of the REFRESH signal because the REFRESH signal is generated based on the OSC signal. In some embodiments, adjusting the frequency of the REFRESH signal in response to changes in temperature saves power. For example, when the temperature decreases, variable bias generator 210 decreases the frequency of the OSC signal. In turn, the frequency of the REFRESH signal also decreases, thereby increasing the refresh cycle time. An increase in refresh cycle time reduces the number of refresh operations. As a result, power is saved.

Figure 3:
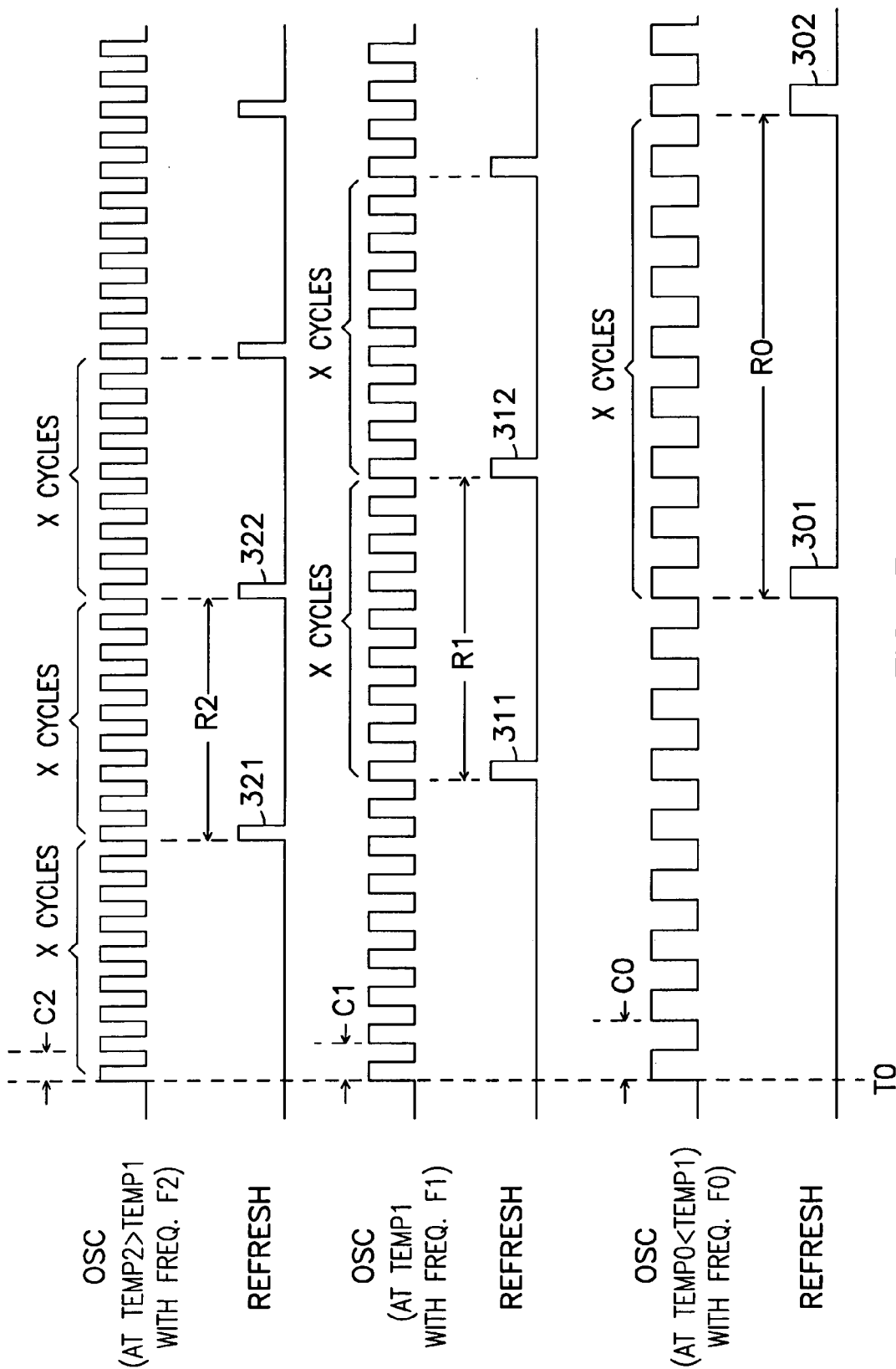
FIG. 3 is an exemplary timing diagram for the refresh timer of FIG. 2.

FIG. 3 is an exemplary timing diagram for the refresh timer 150 of FIG. 2 at various temperatures. Temperatures Temp0, Temp1, Temp2 are exemplary temperatures. Temp2 is greater than Temp1. Temp1 is greater than Temp0. C0, C1, and C2 are exemplary cycles of the OSC signals at Temp0, Temp1, and Temp2, respectively. C2 is smaller than C1. C1 is smaller than C0.

F0, F1, and F2 are exemplary frequencies of the OSC signals at Temp0, Temp1, and Temp2, respectively. Since the frequency of a signal is an inverse of the cycle of the signal, F2 is greater than F1 because C2 is smaller than C1. Similarly, F1 is greater than F0 because C1 is smaller than C0.

FIG. 3 shows that when the temperature increases the frequency of the OSC signal increases. For example, when the temperature increases from Temp1 to Temp2, the frequency of the OSC signal increases from F1 to F2. FIG. 3 also shows that when the temperature decreases, the frequency of the OSC signal decreases. For example, when the temperature decreases from Temp1 to Temp0, the frequency of the OSC signal decreases from F1 to F0. Thus, the frequency of the OSC signal is proportional to the temperature.

FIG. 3 also shows that when the temperature increases, the cycle of the OSC signal decreases. For example, when the temperature increases from Temp1 to Temp2, the cycle of the OSC signal decreases from C1 to C2. FIG. 3 further shows that when the temperature decreases, the cycle of the OSC signal increases. For example, when the temperature decreases from Temp1 to Temp0, the cycle of the OSC signal increases from C1 to C0. Thus, the cycle of the OSC signal is inversely proportional to the temperature.

R0, R1, and R2 are exemplary cycles of the REFRESH signal at Temp0, Temp1, and Temp2, respectively. Each of the cycles R0, R1, and R2 is the interval between two refresh pulses of the REFRESH signal. Cycle R0 is the interval between pulse 301 and 302 of the REFRESH signal at Temp0. Cycle R1 is the interval between pulse 311 and 312 of the REFRESH signal at Temp1. Cycle R2 is the interval between pulse 321 and 322 of the REFRESH signal at Temp2.

FIG. 3 shows that when the temperature increases the cycle of the REFRESH signal decreases. For example, when the temperature increases from Temp1 to Temp2, the cycle of the REFRESH signal decreases from R1 to R2. FIG. 3 also shows that when the temperature decreases, the cycle of the REFRESH signal increases. For example, when the temperature decreases from Temp1 to Temp0, the cycle of the REFRESH signal increases from R1 to R0. Thus, the cycle of the REFRESH signal is inversely proportional to the temperature.

In FIG. 3, X indicates the number of cycles of the OSC signal within one cycle of the REFRESH signal. For example, there are X cycles of the OSC signal within one cycle (R2) of the REFRESH signal at temperature Temp2.

In some embodiments, the refresh pulses of each REFRESH signal are generated after X cycles of the OSC signal is counted. For example, after one X cycles of the OSC signal, refresh pulses 301 is generated; and after another X cycles of the OSC signal, refresh pulse 302 is generated.

In some embodiments, the number of cycles X within one cycle of the REFRESH signal is fixed. Thus, the cycle (e.g., R2) of the REFRESH signal at one temperature (e.g., Temp2) and the cycle (e.g., R1) of the REFRESH signal at another temperature (e.g., Temp1) have equal number of X cycles of the OSC signal. Thus, in some embodiments, X is fixed but the cycle (cycle time) of the REFRESH signal varies when the temperature changes.

Figure 4:
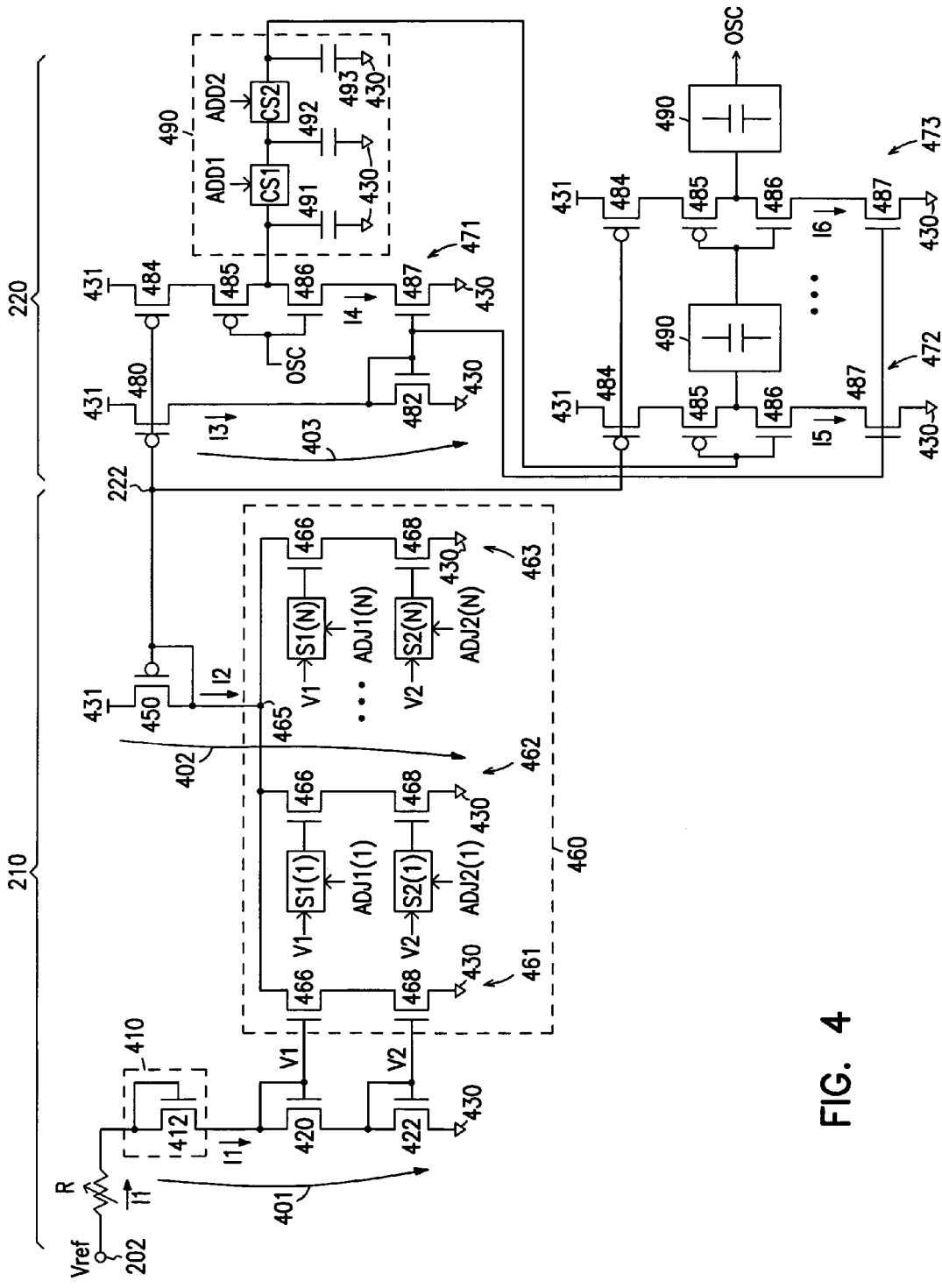
FIG. 4 is a circuit diagram of a variable bias generator and an oscillator according to an embodiment of the invention.

FIG. 4 is a circuit diagram of variable bias generator 210 and oscillator 220 of FIG. 2. Variable bias generator 210 includes a reference current path 401 having a reference current I1, and a control current path 402 having a control current I2. I2 can be selected to be proportional to I1. Oscillator 220 includes a generated current path 403 having a generated current I3. I3 is related to I2. The frequency of the OSC signal is a function of I3. Since I3 is related to I2, and I2 is proportional to I1, the frequency of the OSC signal is also a function of I1 and I2. Thus, the frequency of the OSC signal can be selected by selecting the values of I1, or I2, or a combination of I1 and I2.

When the temperature changes, the value of I1 of variable bias generator 210 changes. Thus, the value of I3 of oscillator 220 also changes. Since the OSC signal is a function of I3, the frequency of the OSC signal changes when I3 changes. As a result, the frequency of the REFRESH signal (FIG. 2) is adjusted because the REFRESH signal is generated based on the OSC signal. Accordingly, the refresh interval is adjusted when temperature changes.

Current path 401 includes a resistor R, a reference current adjuster 410, and a stack of bias transistors 420 and 422, all connected in series between reference node 202 and a supply node 430.

Resistor R is a variable resistor. Thus, the resistance of resistor R can be varied. Different values of I1 can be selected by varying the value of resistor R.

Reference current adjuster 410 creates a voltage drop across reference current adjuster 410 and is constructed such that the voltage drop can be adjusted. Different values of I1 can be selected by adjusting the voltage drop across reference current adjuster 410. In embodiments represented by FIG. 4, reference current adjuster 410 includes a reference transistor 412 connected as a diode. The voltage across reference current adjuster 410 is the voltage drop across the source and drain of transistor 410. In some embodiments, reference current adjuster 410 includes multiple diode-connected transistors connected in series. In those embodiments, the voltage drop across reference current adjuster 410 is total of the voltage drops across the multiple diode-connected transistors. In other embodiments, reference current adjuster 410 includes multiple diode-connected transistors connected in parallel. In some other embodiments, reference current adjuster 410 is omitted. Thus, no voltage drop is created between resistor R and the stack of bias transistors 420 and 422.

Each of the transistors 420 and 422 is a diode-connected transistor. A diode-connected transistor is a transistor having its gate and drain connected together such that the gate-to-source voltage and the drain-to-source voltage are equal. The gate of transistor 420 has a voltage V1. The gate of transistor 422 has a voltage V2.

The discussion shows that the value of I1 of path 401 can be selected by performing one or a combination of the following: varying the value of resistor R, adjusting the voltage drop across reference current adjuster 410 by using different number of transistors, and selecting the threshold voltage of transistors 412, 420, and 422.

In some embodiments, the refresh interval is selected by selecting the frequency for the OSC signal. In some embodiments, the frequency of the OSC signal is selected by selecting the value of I1 according to the discussion above.

I1 is a temperature dependent current. I1 is calculated based on Formula 1 below:

$$I1=(Vref-nVt)/R \qquad \text{(Formula 1)}$$

where Vref the temperature independent at node 202, n is the number of transistors connected in series on between nodes 202 and 430, Vt the threshold voltage of the transistors, and R is the value of the resistor R of FIG. 4. Since Vref is independent of temperature (Vref is constant) and Vt is inversely proportional to the temperature, when the temperature increases, Vt decreases. Thus, I1 (Formula 1) increases. In the opposite, when the temperature decreases, I1 decreases. The increase or decrease in I1 affects I2 and I3. As a result, the frequency of the OSC signal is also affected.

Current path 402 includes a transistor 450 and a control current adjuster 460 connected between a supply node 431 and supply node 430. Control current adjuster 460 controls the amount of current (I2) flowing between a source node 465 and supply node 430. Control current adjuster 460 include current adjusting branches 461, 462, and 463. Branches 461, 462, and 463 and transistors 420 and 422 form a current mirror. Thus, I2 is a mirrored current of I1. I2 is proportional to I1. In some embodiments, I2 is a multiple of I1. I2 can be selected by selecting the value of I1 and by selecting appropriate number of branches 462, and 463 in which I2 flows. In some embodiments, I2 may be a binary multiple of I1. For example, I2=2×I1, or 4×I1, or 8×I1.

FIG. 4 shows three branches 461, 462, and 463 as an example. In some embodiments, the number of branches can be varied. The value of current I2 is the collective amount of current flowing from node 465 to node 430 through one or more of the branches 461, 462, and 463. Thus, I2 is proportional to the number of branches among the branches 461, 462, and 463 that conduct current between nodes 465 and 430. Each of the branches 461, 462, and 463 has a stack of adjusting transistors 466 and 468 connected between nodes 465 and 430. Among the branches 461, 462, and 463, a branch conducts current when transistors 466 and 468 of that branch are connected to V1 and V2. A number of switches control the connections between transistors 466 and V1 and the connections between transistors 468 and V2.

The number of switches include switches S1(1), S1(N), S2(1), and S2(N). Switches S1(1) and S1(N) selectively connect and disconnect transistors 466 from V1 using adjusting signals ADJ1(i) and ADJ1(N). Switches S2(1) and S2(N) selectively connect and disconnect transistors 468 from V2 using adjusting signals ADJ2(1) and ADJ2(N). In some embodiments, when transistor 466 and 468 are disconnected from V1 and V2, the gates of transistor 466 and 468 are connected to ground or to node 430 to turn of transistors 466 and 468. FIG. 4 shows four switches S1(1), S1(N), S2(1), and S2(N) and four corresponding adjusting signals as an example. In some embodiments, the number of switches and the corresponding adjusting signals can be varied.

The ADJ1(1), ADJ1(N), ADJ2(1) and ADJ2(N) signals are activated and deactivated to allow switches S1(1), S1(N), S2(1), and S2(N) to control transistors 466 and 468. For example, when the ADJ1(1) and ADJ2(1) signals are activated and the ADJ1(N) and ADJ2(N) signals are deactivated, switches S1(1) and S2(1) connect transistors 466 and 468 of branch 462 to V1 and V2, respectively. Switches S1(N) and S2(N) leave transistors 466 and 468 of branch 463 disconnected from V1 and V2. When transistors 466 and 468 are disconnected from V1 and V2, the gates of transistors 466 and 468 are connected to ground or to node 430. In this example, I2 flows from node 465 to node 430 through branches 461 and 462. No current flows through branch 463. Thus, I2 equals the collective amount of current flowing in two branches 461, and 462.

As another example, when none of the ADJ1(1), ADJ2(1), ADJ1(N), and ADJ2(N) signals are activated, transistors 466 and 468 of branches 462 and 463 are not connected to V1 and V2. Thus, I2 flows from node 465 to node 430 through only branch 461. In this example, I2 equals the amount of current flowing in only through branches 461.

In the examples above, switches S1(1), S1(N), S2(1), and S2(N) are normally open. Thus, when the corresponding adjusting signal is activated, the corresponding switch is closed to connect transistor 466 or 468 to V1 or V2. In some embodiments, switches S1 and S2 are normally closed. In these embodiments, when the corresponding adjust signal is activated, the corresponding switch is open to disconnect transistor 466 or 468 from V1 or V2 and connects the gate of transistor 466 or 468 to ground or to node 430.

In some embodiments, switches S1(1), S1(N), S2(1), and S2(N) include programmable elements such as fuses, anti-fuses, laser fuses, switch transistors, or other programmable elements. The ADJ1(1), ADJ2(1), ADJ1(N), and ADJ2(N) signals can be programming signals generated internally or external to memory device 100.

As discussed above, the refresh interval can be selected by selecting the frequency for the OSC signal. The frequency for the OSC signal can be selected by selecting the value of I1. Since I2 is related to I1, the frequency of the OSC signal can also be selected by selecting a value of I2 using control current adjuster 460.

Oscillator 220 includes a number of stages 471, 472, and 473. FIG. 4 shows three stages 471, 472, and 473 as an example. In some embodiments, the number of stages can be different from three. The stages 471, 472 and 473 have current I4, I5, and I6, respectively. Each of the current I4, I5, and I6 is related to current I3. In some embodiments, each of the current I4, I5, and I6 is a mirror current of I3 and is proportional to I3. I3 flows in current path 403 formed by transistors 480 and 482. I3 is related to I2. The frequency of the OSC signal is determined in part by current I3, I4, I5, and I6. Since I3 is related to I2, I3 can be adjusted by adjusting I2 to select the frequency of the OSC signal.

Transistors 480 and 482 and control current adjuster 460 form a current mirror in which I3 is a mirrored current of I2. In some embodiments, I3 is proportional to I2. In other embodiments, I3 and I2 are equal. In some embodiments, oscillator 220 is constructed such that I3, I4, I5, and I6 are proportional.

Each of the stages 471, 472, and 473 has a capacitor unit 490 connected to an inverter unit formed by transistors 484-487 (484, 485, 486, and 487). Transistors 484-487 and capacitor unit 490 together operate as one inverting stage of oscillator 220. Stages 471, 472, and 473 are arranged in a configuration to generate an oscillating signal indicated by the OSC signal.

Each of the capacitor 490 is an adjustable capacitor unit. Each capacitor unit 490 includes a number of capacitors 491, 492, and 493 connected in parallel. A number of switches CS1 and CS2 are located between capacitors 491, 492, and 493. FIG. 4 shows three capacitors 491, 492, and 493 and two capacitor switches CS1 and CS2 as an example. In some embodiments, the number of capacitors and capacitor switches in each capacitor unit can be varied. The capacitance of capacitor 490 can be adjusted by controlling switches CS1 and CS2. For example, when CS1 is closed (conductive) and CS2 is opened (non-conductive), the capacitance of capacitor 490 is the parallel combination of the capacitances of capacitors 491 and 492. Thus, by controlling CS1 and CS2, the number of capacitors within capacitor unit 490 can be added (increased) or subtracted (decreased) to adjust the capacitance of capacitor unit 490.

Each of the CS1 and CS2 is controlled by a controlled signal. For example control signal ADD1 controls CS1, control signal ADD2 controls CS2. In some embodiments, the signal levels of the ADD1 and ADD2 signals open or close switches CS1 and CS2.

In some embodiments, switches CS1 and CS2 include programmable elements such as fuses, antifuses, laser fuses, switch transistors, or other programmable elements. The ADD1 and ADD2 signals can be programming signals generated internally or external to memory device 100.

The frequency of the OSC signal is a function of the capacitance of capacitor unit 490 and the current (I4, I5, or I6) of each of the stages 471, 472, and 473. In operation, each capacitor unit 490 goes through a charge and discharge cycle. The frequency of the OSC signal depends in part on the timing of the charge and discharge cycle of capacitor unit 490. Thus, the frequency of the OSC signal can be selected by adjusting the capacitance of each capacitor unit 490.

The frequency (F) of the OSC signal is determined by Formula 2 below:

$$F=(n*I)/(V*C) \quad \text{(Formula 2)}$$

where n is the number of stages of oscillator 220, I is the current in each of the stages such as I3 (I4, I5, or I6), V is the voltage at node 431, and C is the capacitance of capacitor unit 490. Formula 2 shows only the capacitance C of capacitor unit 490. Formula 2 omits other capacitances such as the parasitic capacitances of the output and the input nodes of each of the stages 471, 472, and 473 because the other capacitances are assumed to be substantially less than capacitance C.

Based on Formula 2, an initial frequency of OSC signal can be selected by adjusting I3, or by adjusting the capacitance of capacitor unit 490, or by adjusting both I3 and the capacitance of capacitor unit 490. As discussed above, I3 can be adjusted by adjusting I2 using control current adjuster 460.

In some embodiments, the initial frequency of OSC is selected so that an initial frequency of the REFRESH can be selected accordingly.

After the initial frequency of the OSC signal is selected, the selected frequency of the OSC signal is automatically adjusted by bias variable generator 210 when the temperature changes. As a result, the frequency of the REFRESH signal (FIG. 2) is also automatically adjusted because the REFRESH signal is generated based on the OSC signal. Accordingly, the refresh interval is automatically adjusted when temperature changes. In some embodiments, adjusting the refresh interval based on changes in temperature save power.

Figure 5:
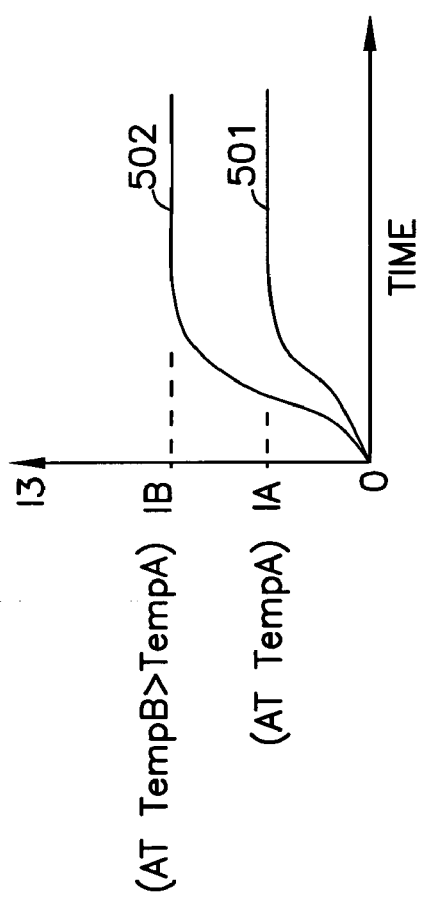
FIG. 5 is an exemplary graph showing current vs. temperature for FIG. 4.

FIG. 5 is an exemplary graph showing current vs. temperature for FIG. 4. In FIG. 5, curve 501 represents current I3 (FIG. 4) at temperature TempA. Curve 502 represents current I3 at temperature TempB. TempB is greater than TempA. IA represents the value of I3 at TempA. IB represents the value of I3 at TempB. IB is greater than IA. In some embodiments, TempA is about −40° C. and TempB is about 110° C. As shown in FIG. 5, I3 increases from IA to IB when the temperature increases (temperature increases from TempA to TempB). I3 decreases when the temperature decreases (temperature decreases from TempB to TempA). Based on formula 2 above, F=(n*I)/(V*C), the frequency of the OSC signal (FIG. 4) is proportional to current 1 (I3). FIG. 5 shows that I3 is proportional to temperature. Thus, the frequency of the OSC signal is also proportional to the temperature.

Figure 6:
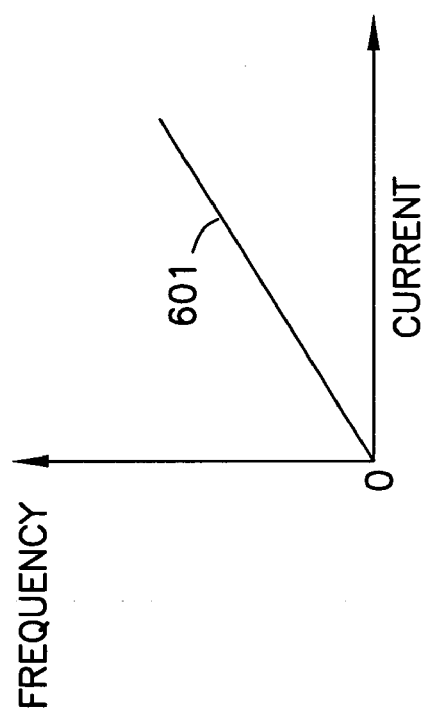
FIG. 6 is an exemplary graph showing frequency vs. current for FIG. 4.

FIG. 6 is an exemplary graph showing frequency vs. current for FIG. 4. In FIG. 6, line 601 represents the frequency of the OSC signal of FIG. 4. As shown in the FIG. 6, the frequency of the OSC signal is proportional to the current I3. The frequency increases when I3 increases. The frequency decreases when I3 decreases.

Figure 7:
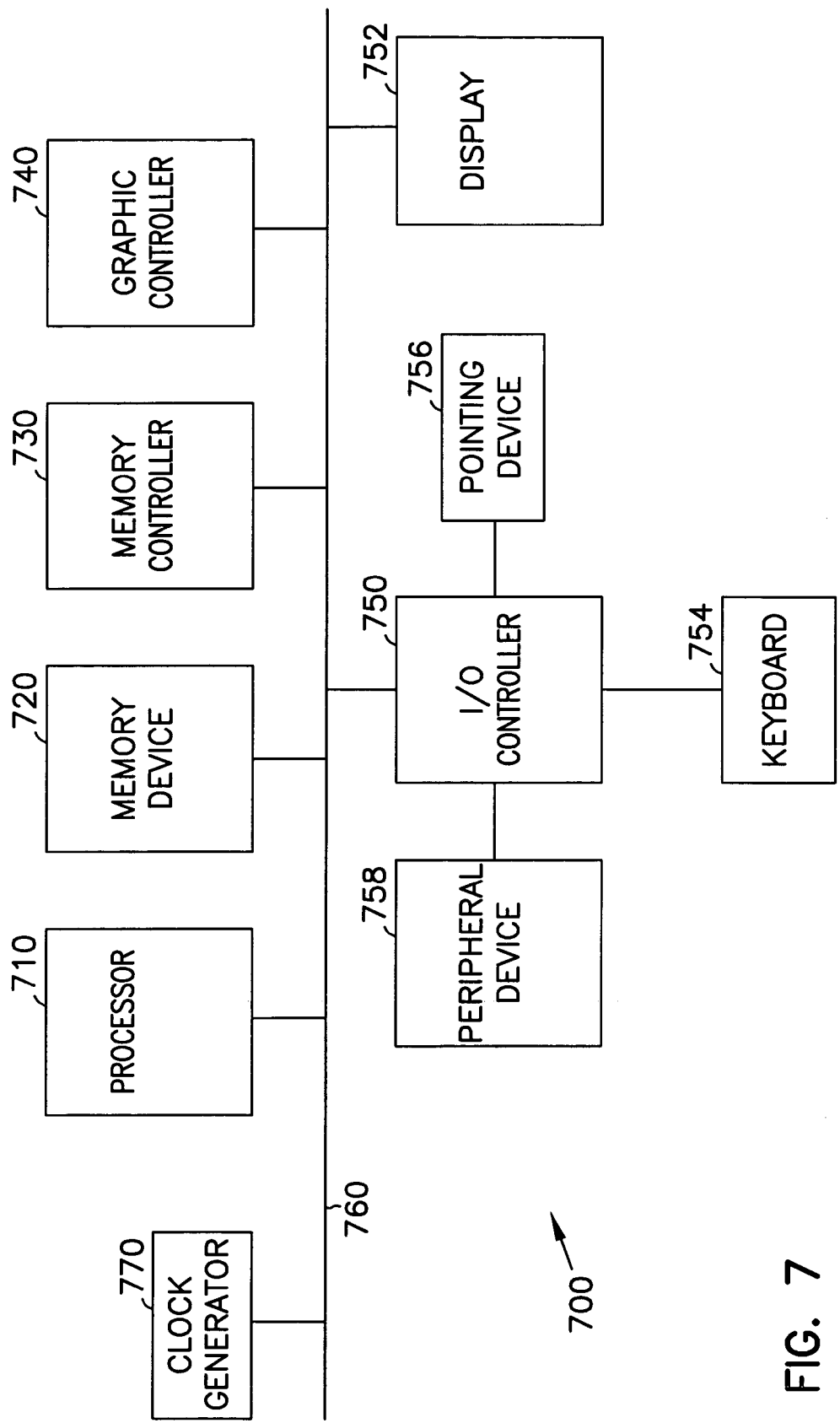
FIG. 7 shows a system according to an embodiment of the invention.

FIG. 7 shows a system 700. System 700 includes a processor 710, a memory device 720, a memory controller 730, a graphic controller 740, and an input and output (I/O) controller 750, a display 752, a keyboard 754, a pointing device 756, and a peripheral device 758. A bus 760 couples all of these devices together. A clock generator 770 provides an external signal to at least one of the devices of system 700 via bus 760. Two or more devices shown in system 700 may be formed in a single chip.

Memory device 720 includes memory device 100 (FIG. 1). Further, at least one of the devices shown in system 700 includes a timer such as refresh timer 150 as described in FIG. 1 through FIG. 6.

Bus 760 may be interconnect traces on a circuit board or may be one or more cables. Bus 760 may also couple the devices of system 700 by wireless means such as by electromagnetic radiations, for example, radio waves. Peripheral device 758 may be a printer, an optical device such as CD-ROM and DVD reader and writer, a magnetic device reader and writer such as a floppy disk driver, or an audio device such as a microphone.

System 700 represented by FIG. 7 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

CONCLUSION

Various embodiments of the invention provide circuits and methods of temperature compensation for refresh oscillator of a memory device. Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. A memory device comprising:

a number of memory cells;

a refresh controller for initiating a refresh operation to refresh the memory cells at a refresh interval; and a refresh timer connected to the refresh controller and responsive to a temperature independent voltage for influencing the refresh interval to be inversely proportional to temperature.

2. The memory device of claim 1, wherein the refresh timer includes an oscillator for generating an oscillating signal having a cycle inversely proportional to temperature.

3. The memory device of claim 2, wherein the refresh timer further includes a variable bias generator connected to the oscillator for increasing the cycle of the oscillating signal when the temperature decreases.

4. The memory device of claim 3, wherein the refresh timer further includes a timing generator connected to the oscillator for generating a refresh signal having a number of refresh pulses.

5. The memory device of claim 4, wherein the timing generator includes a counter for counting a number of cycles of the oscillating signal to generate each of the number of the refresh pulses after a count.

6. The memory device of claim 2, wherein the refresh timer further includes a variable bias generator connected to the oscillator for decreasing the cycle of the oscillating signal when the temperature increases.

7. A memory device comprising:
a number of memory cells;
a refresh controller for initiating a refresh operation to refresh the memory cell at a refresh interval; and
a refresh timer connected to the refresh controller for influencing the refresh interval to be inversely proportional to temperature, wherein the refresh timer includes reference current path for receiving a temperature independent voltage to generate a temperature dependent reference current for influencing the refresh interval.

8. The memory device of claim 7, wherein the refresh timer further includes an oscillator for generating an oscillating signal based on the temperature dependent reference current.

9. The memory device of claim 8, wherein the refresh timer further includes a timing generator connected to the oscillator for generating a refresh signal having a cycle based on a number of cycles of the oscillating signal.

10. A memory device comprising:
a number of memory cells;
a refresh controller for initiating a refresh operation to refresh the memory cells at a refresh interval based on a refresh signal;
a variable bias generator having a reference node for receiving a temperature independent voltage, and a reference current path including a resistor coupled to the reference node for generating a temperature dependent reference current;
an oscillator for generating an oscillating signal based on the reference current; and
a timing generator for receiving the oscillating signal to generate the refresh signal.

11. The memory device of claim 10, wherein the refresh interval corresponds to a cycle of the refresh signal.

12. The memory device of claim 11, wherein the cycle of the refresh signal is inversely proportional to temperature.

13. The memory device of claim 10, wherein the refresh signal has a plurality of refresh pulses, and wherein the timing generator is configured for generating each refresh pulse of the plurality refresh pulses based on a plurality of cycles of the oscillating signal.

14. The memory device of claim 10, wherein the variable bias generator includes an adjustable current path for generating an adjustable control current based on the reference current.

15. The memory device of claim 14, wherein the oscillator includes a current path for generating a generated current based on the adjustable control current for influencing a frequency of the oscillating signal.

16. The memory device of claim 15, wherein the current path of the oscillator and the adjustable current path of the variable bias generator are coupled in a current mirror configuration.

17. A memory device comprising:
a number of memory cells;
a refresh controller for initiating a refresh operation to refresh the memory cells at a refresh interval based on a refresh signal;
a reference node for receiving a temperature independent voltage, and a resistor coupled to the reference node for providing a temperature dependent reference current based on the temperature independent voltage;
a first current mirror for generating a control current based on the reference current;
a second current mirror coupled to the first current mirror for generating a generated current based on the control current;
a number of stages for generating an oscillating signal based on the generated current; and
a timing generator for receiving the oscillating signal to generate the refresh signal.

18. The memory device of claim 17, wherein the refresh interval is equal to a cycle of the refresh signal.

19. The memory device of claim 18, wherein the cycle of the refresh signal is inversely proportional to temperature.

20. The memory device of claim 17, wherein the refresh signal has a plurality of refresh pulses, and wherein the timing generator includes a counter for counting a plurality of cycles of the oscillating signal to generate each refresh pulse of the plurality of refresh pulses after the plurality of cycles of the oscillating signal is counted by the counter.

21. The memory device of claim 17, wherein the oscillating signal has an oscillating frequency proportional to temperature.

22. The memory device of claim 17, wherein the second current mirror includes a control current adjuster for adjusting the control current for influencing the generated current.

23. The memory device of claim 17, wherein at least one of the stages includes an adjustable capacitor unit for varying a capacitance of the stages.

24. The memory device of claim 17, wherein each of the stages is an inverting stage.

25. A memory device comprising:
a number of memory cells;
a refresh controller for initiating a refresh operation to refresh the memory cells at a refresh interval based on a refresh signal;
a variable resistor coupled to a reference node;
a stack of bias transistors coupled between the variable resistor and a supply node for generating a reference current dependent on temperature;
a control current adjuster coupled to the stack of bias transistors for controlling a control current between a source node and the supply node, the control current being proportional to the reference current;
an oscillator for generating an oscillating signal based on the control current; and a timing generator for receiving the oscillating signal to generate a refresh signal having a plurality of refresh pulses.

26. The memory device of claim 25, wherein the refresh interval corresponds to a cycle of the refresh signal.

27. The memory device of claim 26, wherein the cycle of the refresh signal is inversely proportional to temperature.

28. The memory device of claim 25, wherein the timing generator is configured for causing a cycle of the refresh signal to be dependent on a time interval of multiple cycles of the oscillating signal.

29. The memory device of claim 25, wherein the timing generator is configured for causing a cycle of the refresh signal to be equal to a fixed number of cycles of the oscillating signal.

30. The memory device of claim 25, wherein the oscillator includes:
a current path coupled to the control current adjuster for generating a generated current based on the control current; and
a number of stages for generating the oscillating signal based on the generated current.

31. The memory device of claim 25, wherein the control current adjuster includes a number of branches coupled in parallel between the source node and the supply node, wherein a current in each of the branches is adjustable for influencing an amount of the control current between the source node and the supply node.

32. A system comprising:
a processor; and
a memory device connected to the processor, the memory device including:
a memory array;
a refresh controller for initiating a refresh operation to refresh the memory array at a refresh interval; and
a refresh timer connected to the refresh controller and responsive to a temperature independent voltage for expanding the refresh interval when temperature decreases.

33. The system of claim 32, wherein the refresh timer includes an oscillator for generating an oscillating signal having a cycle inversely proportional to temperature.

34. The system of claim 33, wherein the refresh timer further includes a variable bias generator connected to the oscillator for increasing the cycle of the oscillating signal when the temperature decreases.

35. The system of claim 34, wherein the refresh timer further includes a timing generator connected to the oscillator for generating a refresh signal having a number of refresh pulses.

36. The system of claim 35, wherein the timing generator includes a counter for counting a number of cycles of the oscillating signal to generate each of the number of the refresh pulses after a count.

37. A system comprising:
a processor; and
a memory device connected to the processor, the memory device including:
a memory array;
a refresh controller for initiating a refresh operation to refresh the memory array at a refresh interval; and
a refresh timer connected to the refresh controller for expanding the refresh interval when temperature decreases, wherein the refresh timer includes reference current path for receiving a temperature independent voltage to generate a temperature dependent reference current for influencing the refresh interval.

38. The system of claim 37, wherein the refresh timer further includes an oscillator for generating an oscillating signal based on the temperature dependent reference current.

39. The system of claim 38, wherein the refresh timer further includes a timing generator connected to the oscillator for generating a refresh signal having a cycle based on a number of cycles of the oscillating signal.

40. A system comprising:
a processor; and
a memory device connected to the processor, the memory device including:
a number of memory cells;
a refresh controller for initiating a refresh operation to refresh the memory cells at a refresh interval based on a refresh signal;
a variable bias generator having a reference node for receiving a temperature independent voltage, and a reference current path including a resistor coupled to the reference node for generating a temperature dependent reference current;
an oscillator for generating an oscillating signal based on the reference current; and
a timing generator for receiving the oscillating signal to generate the refresh signal.

41. The system of claim 40, wherein the refresh interval corresponds to a cycle of the refresh signal.

42. The system of claim 41, wherein the cycle of the refresh signal is inversely proportional to temperature.

43. The system of claim 40, wherein the refresh signal has a plurality of refresh pulses, and wherein the timing generator is configured for generating each refresh pulse of the plurality refresh pulses based on a plurality of cycles of the oscillating signal.

44. A method comprising:
generating an oscillating signal having a cycle inversely proportional to the temperature, wherein the oscillating signal is generated based on a temperature independent voltage;
generating a refresh signal having a cycle based on the cycle of the oscillating signal; and
refreshing a number of memory cells at a refresh interval based on the cycle of the refresh signal.

45. The method of claim 44, wherein the refresh interval decreases when the temperature increases.

46. The method of claim 45, wherein the refresh interval increases when the temperature decreases.

47. A method comprising:
generating an oscillating signal having a cycle inversely proportional to the temperature, wherein generating an oscillating signal includes generating a control current, wherein the control current is temperature dependent, mirroring the control current to generate a generated current, and using the generated current to generate the oscillating signal; and
generating a refresh signal having a cycle based on the cycle of the oscillating signal; and
refreshing a number of memory cells at a refresh interval based on the cycle of the refresh signal.

48. The method of claim 47, wherein generating a control current includes mirroring a reference current to generate the control current.

49. The method of claim 48, wherein the reference current is generated based on a reference voltage independent of temperature.

50. A method comprising:
generating a temperature dependent reference current through a resistor coupled to a temperature independent reference voltage;
generating a control current based on the reference current, wherein the control current is temperature dependent;

generating an oscillating signal based on the control current, wherein the oscillating signal has an oscillating frequency dependent on temperature;

generating a refresh signal based on the oscillating signal, the refresh signal having a plurality of refresh pulses; and refreshing a number of memory cells at a refresh interval based on the refresh signal.

51. The method of claim 50, wherein generating the refresh signal includes causing a time interval between two consecutive refresh pulses to be dependent on a time interval of multiple cycles of the oscillating signal.

52. The method of claim 50, wherein generating the refresh signal includes generating each refresh pulse of the plurality refresh pulses based on a fixed number of cycles of the oscillating signal.

53. The method of claim 50, wherein generating the control current includes mirroring the reference signal to generate the control current.

54. The method of claim 53, wherein generating the control current includes adjusting the control current to influence a frequency of the oscillating signal.

55. The method of claim 54, wherein generating the oscillating signal includes mirroring the control current to generate the oscillating signal.

56. The method of claim 55, wherein generating the oscillating signal includes adjusting a capacitance in propagating path of the oscillating signal for influencing a frequency of the oscillating signal.

* * * * *

UNITED STATES PATENT AND TRADEMARK OFFICE
CERTIFICATE OF CORRECTION

PATENT NO.       : 7,292,489 B2
APPLICATION NO. : 11/215495
DATED            : November 6, 2007
INVENTOR(S)      : Lin It is certified that error appears in the above-identified patent and that said Letters Patent is hereby corrected as shown below:

In column 11, line 28, in Claim 7, delete "cell" and insert -- cells --, therefor.

Signed and Sealed this

Twenty-fifth Day of March, 2008

JON W. DUDAS
*Director of the United States Patent and Trademark Office*